United States Patent
Wen et al.

(10) Patent No.: US 10,510,823 B2
(45) Date of Patent: Dec. 17, 2019

(54) IMPEDANCE CIRCUIT WITH POLY-RESISTOR

(71) Applicant: MEDIATEK INC., Hsin-Chu (TW)

(72) Inventors: Sung-Han Wen, Hsin-Chu (TW); Kuan-Ta Chen, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/693,548

(22) Filed: Sep. 1, 2017

(65) Prior Publication Data
US 2018/0102404 A1 Apr. 12, 2018

Related U.S. Application Data

(60) Provisional application No. 62/407,070, filed on Oct. 12, 2016.

(51) Int. Cl.
| | |
|---|---|
| H01L 49/02 | (2006.01) |
| H01L 29/06 | (2006.01) |
| H01L 27/08 | (2006.01) |
| H03F 1/32 | (2006.01) |
| H03F 3/45 | (2006.01) |

(52) U.S. Cl.
CPC .......... *H01L 28/20* (2013.01); *H01L 27/0802* (2013.01); *H01L 29/0649* (2013.01); *H03F 1/3211* (2013.01); *H03F 3/45475* (2013.01); *H03F 3/45973* (2013.01); *H03F 2203/45424* (2013.01); *H03F 2203/45522* (2013.01); *H03F 2203/45524* (2013.01)

(58) Field of Classification Search
USPC ....................................................... 257/538
See application file for complete search history.

(56) References Cited

U.S. PATENT DOCUMENTS

| | | | |
|---|---|---|---|
| 4,164,668 A | 8/1979 | Delaporte et al. | |
| 4,263,518 A | 4/1981 | Ballatore et al. | |
| 5,027,081 A | 6/1991 | Baum | |
| 6,087,677 A | 7/2000 | Wu | |
| 7,105,912 B2 | 9/2006 | Chen et al. | |

(Continued)

FOREIGN PATENT DOCUMENTS

| | | |
|---|---|---|
| EP | 17196034.7 | 2/2018 |
| EP | 3309850 A2 | 4/2018 |

(Continued)

OTHER PUBLICATIONS

McAndrew, C.C.; "Compact Modeling—Principles, Techniques and Applications;" 2010; pp. 282-284.

(Continued)

*Primary Examiner* — Zandra V Smith
*Assistant Examiner* — Lawrence C Tynes, Jr.
(74) *Attorney, Agent, or Firm* — Wolf, Greenfield & Sacks, P.C.

(57) ABSTRACT

An impedance circuit includes a poly-resistor and a controller. The poly-resistor has a first terminal and a second terminal. The controller generates a first control voltage and a second control voltage. The resistance between the first terminal and the second terminal of the poly-resistor is determined according to the first control voltage and the second control voltage. The second control voltage is different from the first control voltage. The proposed impedance circuit can improve the linearity of the poly-resistor.

15 Claims, 9 Drawing Sheets

(56) References Cited

U.S. PATENT DOCUMENTS

| | | | |
|---|---|---|---|
| 7,199,016 | B2 | 4/2007 | Heston et al. |
| 8,482,099 | B2 | 7/2013 | Enjalbert |
| 8,878,334 | B1 * | 11/2014 | Ratnakumar ....... H01L 27/0738 257/528 |
| 9,467,100 | B2 | 10/2016 | Dhanasekaran |
| 9,685,435 | B2 | 6/2017 | Lui et al. |
| 2004/0070050 | A1 | 4/2004 | Chi |
| 2009/0002120 | A1 * | 1/2009 | Molin ................... H01C 10/14 338/195 |
| 2009/0085657 | A1 | 4/2009 | Yang et al. |
| 2010/0007535 | A1 * | 1/2010 | Schwarzer .......... H04L 25/0278 341/120 |
| 2010/0109775 | A1 | 5/2010 | Kamakura et al. |
| 2011/0248787 | A1 | 10/2011 | Jiang |
| 2012/0306017 | A1 * | 12/2012 | Edelstein .............. H01L 23/525 257/365 |
| 2016/0276990 | A1 * | 9/2016 | Aoyama ............. H03F 3/45475 |
| 2017/0187336 | A1 * | 6/2017 | Mehrabi .................. H03F 1/34 |
| 2018/0102404 | A1 | 4/2018 | Wen et al. |
| 2018/0233499 | A1 | 8/2018 | Wen et al. |

FOREIGN PATENT DOCUMENTS

| | | | | |
|---|---|---|---|---|
| EP | 18177526.3 | | 12/2018 | |
| GB | 1 431 199 | A | 4/1976 | |
| GB | 1431199 | A * | 4/1976 | .............. H03H 7/24 |
| JP | 1431199 | * | 4/1976 | |
| TW | 308718 | B | 6/1997 | |
| TW | 200810140 | A | 2/2008 | |
| TW | 201433956 | A | 9/2014 | |
| TW | 1487009 | B | 6/2015 | |
| TW | 201635559 | A | 10/2016 | |
| TW | I595749 | B | 8/2017 | |

OTHER PUBLICATIONS

Extended European Search Report dated May 4, 2018 in connection with Application No. EP 17196034.
Partial European Search Report for European Application No. EP 17196034.7 dated Feb. 13, 2018.
Extended European Search Report for European Application No. EP 18177526.3 dated Dec. 3, 2018.
U.S. Appl. No. 15/953,772, filed Apr. 16, 2018, Wen et al.

\* cited by examiner

IMPEDANCE CIRCUIT WITH POLY-RESISTOR

CROSS REFERENCE TO RELATED APPLICATIONS

This application claims the benefit of U.S. Provisional Application No. 62/407,070, filed on Oct. 12, 2016, the entirety of which is incorporated by reference herein.

BACKGROUND OF THE INVENTION

Field of the Invention

The disclosure generally relates to an impedance circuit, and more specifically, to an impedance circuit and a poly-resistor therein.

Description of the Related Art

Poly-resistors are characterized by their sheet resistance values. In order to reduce the chip size, the poly-resistors with high sheet resistance values are often used and fabricated in a small area, and they are extensively used in a variety of integrated circuits.

However, the depletion effect is a phenomenon in which there is unwanted variation in the threshold voltage of devices using poly-silicon as a gate material, leading to unpredictable behavior on the part of electronic circuits. It results in serious non-linearity of the poly-resistors. Accordingly, there is a need for a novel solution for suppressing the non-ideal depletion effect in poly-resistors.

BRIEF SUMMARY OF THE INVENTION

In a preferred embodiment, the disclosure is directed to an impedance circuit including a poly-resistor and a controller. The poly-resistor has a first terminal and a second terminal. The controller generates a first control voltage and a second control voltage. The resistance between the first terminal and the second terminal of the poly-resistor is determined according to the first control voltage and the second control voltage. The second control voltage is different from the first control voltage. The proposed impedance circuit can improve the linearity of the poly-resistor.

In some embodiments, the poly-resistor includes a poly-silicon layer, a channel layer, and an insulation layer. The poly-silicon layer has a first end and a second end. The first end of the poly-silicon layer is coupled to the first terminal of the poly-resistor, and the second end of the poly-silicon layer is coupled to the second terminal of the poly-resistor. The channel layer has a first end and a second end. The first end of the channel layer is arranged for receiving the first control voltage, and the second end of the channel layer is arranged for receiving the second control voltage. The insulation layer is disposed between the poly-silicon layer and the channel layer.

In some embodiments, the first end of the channel layer is close to the first end of the poly-silicon layer, and the second end of the channel layer is close to the second end of the poly-silicon layer.

In some embodiments, the channel layer is a conductive layer, a semiconductor layer, or another poly-silicon layer.

In some embodiments, the channel layer is an n-well, and the first end and the second end of the channel layer are n+ doped regions.

In some embodiments, the channel layer is a p-well, and the first end and the second end of the channel layer are p+ doped regions.

In some embodiments, the insulation layer is made of different materials, such as a silicon dioxide layer, a field oxide (FOX) layer, or shallow trench isolation (STI) layer.

In some embodiments, the first control voltage and the second control voltage are dynamic.

In some embodiments, the first control voltage and the second control voltage are determined according to a first voltage at the first terminal of the poly-resistor, and a second voltage at the second terminal of the poly-resistor.

In some embodiments, each of the first control voltage and the second control voltage is a linear function of the first voltage and the second voltage.

In some embodiments, the first control voltage is substantially equal to the first voltage, and the second control voltage is substantially equal to the second voltage.

In some embodiments, the poly-resistor is a feedback resistor.

In some embodiments, the poly-resistor is a common-mode feedback resistor.

In some embodiments, the poly-resistor is used in a differential or pseudo-differential amplifier.

In some embodiments, the poly-resistor is used in a differential-to-single-ended amplifier.

In some embodiments, the poly-resistor is used in an inverting amplifier.

In some embodiments, the poly-resistor comprises a plurality of sub-poly-resistors coupled in series.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention will be described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
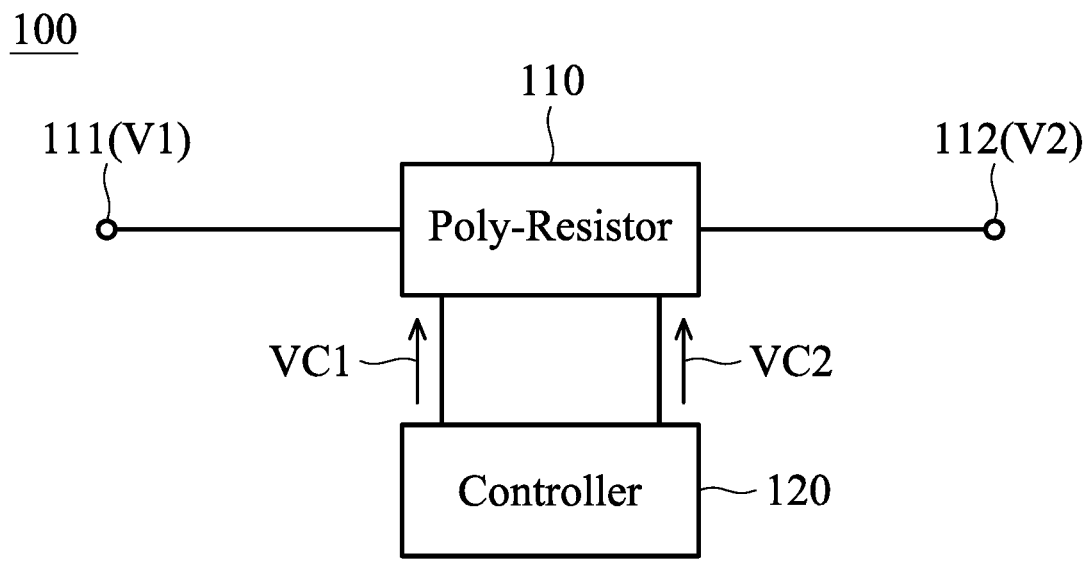
FIG. 1 is a diagram of an impedance circuit according to an embodiment of the invention.

FIG. 1 is a diagram of an impedance circuit 100 according to an embodiment of the invention. The impedance circuit 100 includes a poly-resistor 110 and a controller 120. The poly-resistor 110 has a first terminal 111 and a second terminal 112. If a second voltage V2 at the second terminal 112 is higher than a first voltage V1 at the first terminal 111 (i.e., a driving voltage difference (V2-V1) is applied to the poly-resistor 110), a current through the poly-resistor 110 will flow from the second terminal 112 to the first terminal 111. The controller 120 may be a voltage generator, a voltage divider, or a weighted summer circuit. The controller 120 is configured to generate a first control voltage VC1 and a second control voltage VC2 for controlling the poly-resistor 110. The resistance between the first terminal 111 and the second terminal 112 of the poly-resistor 110 is determined according to the first control voltage VC1 and the second control voltage VC2. In one embodiment, the second control voltage VC2 is different from the first control voltage VC1.

Such a design can improve the linearity of the poly-resistor 110. Please refer to the following embodiments and figures. It should be noted that these embodiments and figures are exemplary, rather than restricted limitations of the invention.

Figure 2:
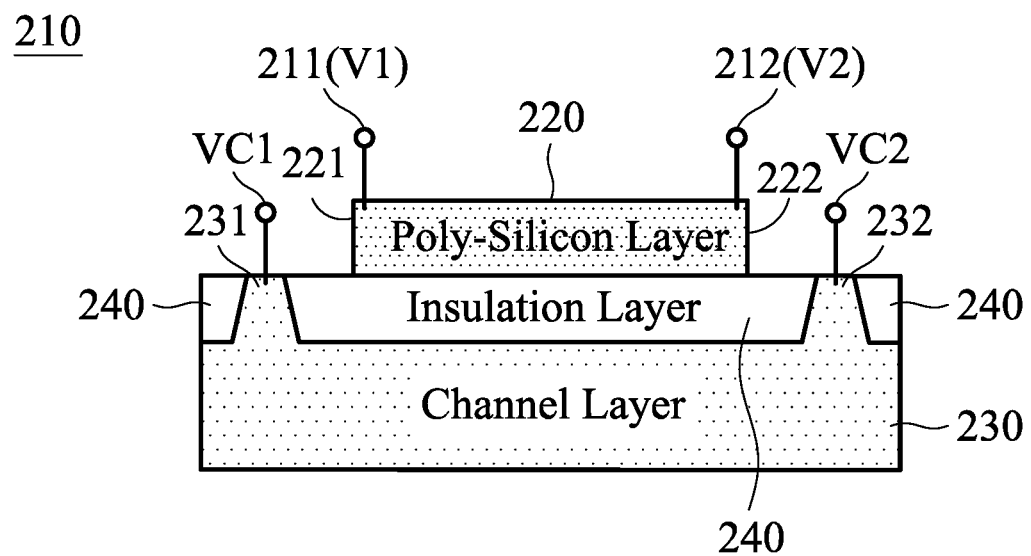
FIG. 2 is a diagram of a poly-resistor according to an embodiment of the invention.

FIG. 2 is a diagram of a poly-resistor 210 according to an embodiment of the invention. FIG. 2 illustrates the detailed physical structure of the poly-resistor 110 of FIG. 1. In FIG. 2, the poly-resistor 210 with a first terminal 211 and a second terminal 212 includes a poly-silicon layer 220, a channel layer 230 and an insulation layer 240. The poly-silicon layer 220 has a first end 221 and a second end 222, which are located apart from each other. The first end 221 of the poly-silicon layer 220 is coupled to the first terminal 211 of the poly-resistor 210, and the second end 222 of the poly-silicon layer 220 is coupled to the second terminal 212 of the poly-resistor 210. If a second voltage V2 at the second terminal 212 is higher than a first voltage V1 at the first terminal 211 (i.e., a driving voltage difference (V2-V1) is applied to the poly-resistor 210), a current through the poly-resistor 210 will flow from the second terminal 212 to the first terminal 211. That is, the current may flow through the poly-silicon layer 220, from the second end 222 to the first end 221. The channel layer 230 may be a conductive layer, a semiconductor layer, or another poly-silicon layer which is different from the poly-silicon layer 220. The channel layer 230 has a first end 231 and a second end 232, which are located apart from each other. The first end 231 of the channel layer 230 is arranged for receiving the first control voltage VC1, and the second end 232 of the channel layer 230 is arranged for receiving the second control voltage VC2. In some embodiments, the first end 231 of the channel layer 230 is closer to the first end 221 of the poly-silicon layer 220 than to the second end 232 of the channel layer 230, and the second end 232 of the channel layer 230 is closer to the second end 222 of the poly-silicon layer 220 than to the first end 231 of the channel layer 230. As a result, the first control voltage VC1 controls the operation characteristic (e.g., the resistance) of the first end 221 of the poly-silicon layer 220, and the second control voltage VC2 controls the operation characteristic (e.g., the resistance) of the second end 222 of the poly-silicon layer 220. The insulation layer 240 may be made of any nonconductive material. The insulation layer 240 is disposed between the poly-silicon layer 220 and the channel layer 230, and is configured to isolate the poly-silicon layer 220 from the channel layer 230.

Please refer to FIG. 1 further in view of FIG. 2 and understand the operation theory of the invention. To suppress the depletion effect of the poly-resistor 110, the first control voltage VC1 and the second control voltage VC2 may be dynamic, instead of being constant values. For example, the first control voltage VC1 and the second control voltage VC2 may be determined according to the first voltage V1 at the first terminal 111 of the poly-resistor 110, and the second voltage V2 at the second terminal 112 of the poly-resistor 110. That is, each of the first control voltage VC1 and the second control voltage VC2 may be a function of the first voltage V1 and the second voltage V2. The aforementioned functions may be linear and expressed as the following equations (1) to (3):

$$VC1 = f(V1, V2) = A \cdot V1 + B \cdot V2 \tag{1}$$

$$VC2 = g(V1, V2) = C \cdot V1 + D \cdot V2 \tag{2}$$

$$VC2 \neq VC1 \tag{3}$$

where "VC1" represents the first control voltage VC1, "VC2" represents the second control voltage VC2, "V1" represents the first voltage V1, "V2" represents the second voltage V2, and each of "A", "B", "C", and "D" represents a respective value.

The above values A, B, C, and D are adjustable in response to different requirements. Specifically, when the controller 120 dynamically adjusts the first control voltage VC1 and the second control voltage VC2 in response to the first voltage V1 and the second voltage V2, the depletion effect of the poly-resistor 110 can be suppressed. The proposed impedance circuit is more linear and more concentrated than the conventional poly-resistor in which only one control voltage is applied to the poly-resistor, or the control voltage applied to the poly-resistor is fixed.

In some embodiments, the first control voltage VC1 is substantially equal to the first voltage V1, and the second control voltage VC2 is substantially equal to the second voltage V2. That is, according to the equations (1) to (3), the values A and D are both set to 1, and the values B and C are both set to 0. Please refer to the physical structure of FIG. 2. If the first control voltage VC1 is equal to the first voltage V1 and the second control voltage VC2 is equal to the second voltage V2, the control voltage difference (e.g., VC2−VC1) between the second control voltage VC2 and the first control voltage VC1 will be the same as the driving voltage difference (e.g., V2−V1) between the second terminal 212 and the first terminal 211 of the poly-resistor 210. The control voltage difference (e.g., VC2−VC1) is uniformly distributed over the channel layer 230, and it is consistent with the driving voltage difference (e.g., V2−V1) which is uniformly distributed over the poly-silicon layer 220. With such a design, the channel layer 230 has almost the same voltage level distribution as that of the poly-silicon layer 220, and no effective voltage difference exists between the channel layer 230 and the poly-silicon layer 220. Therefore, compared with the conventional method applying only one control voltage, the depletion effect of the poly-resistor 210 can be eliminated, and the poly-resistor 210 can provide resistance to accomplish better and more concentrated linearity.

Figure 3:
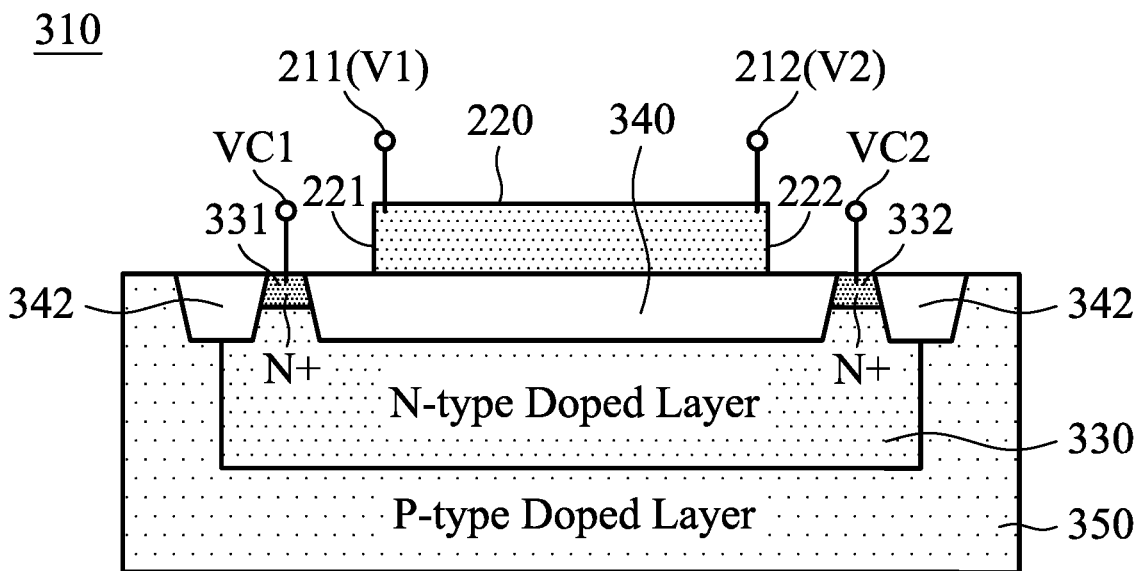
FIG. 3 is a diagram of a poly-resistor according to an embodiment of the invention.
Figure 4:
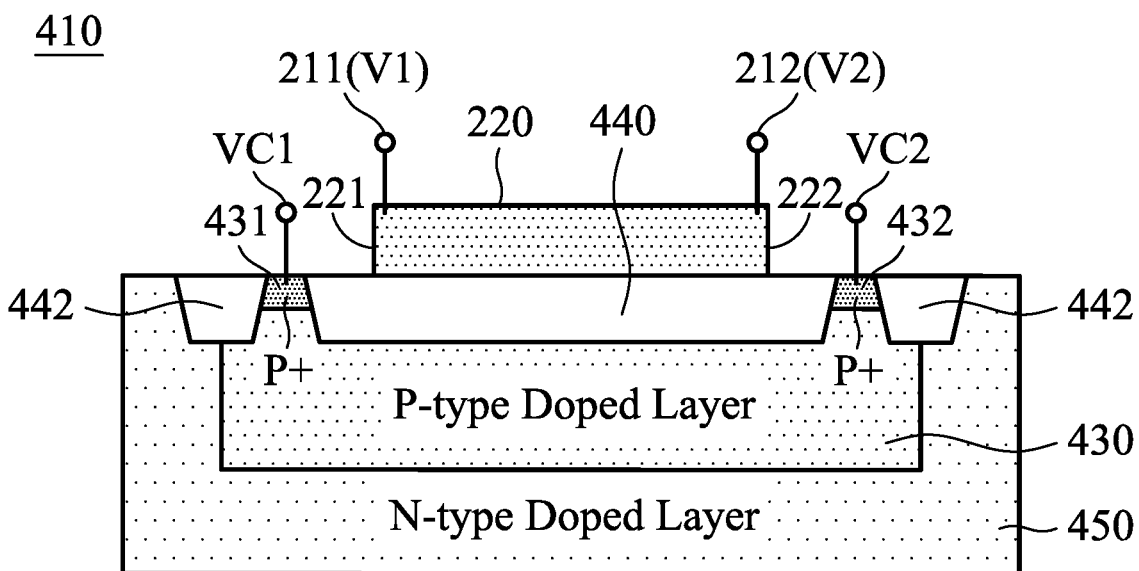
FIG. 4 is a diagram of a poly-resistor according to an embodiment of the invention.

FIG. 3 is a diagram of a poly-resistor 310 according to an embodiment of the invention. FIG. 3 is similar to FIG. 2. In the embodiment of FIG. 3, a channel layer 330 of the poly-resistor 310 is an N-type doped layer, which may be configured in a P-type doped layer 350, and a first end 331 and a second end 332 of the channel layer 330 are n+ doped regions. An insulation layer 340 of the poly-resistor 310 can be of different materials, such as a silicon dioxide layer, a field oxide (FOX) layer, or a Shallow Trench Isolation (STI) layer, but is not limited thereto. Other features of the poly-resistor 310 of FIG. 3 are similar to those of the poly-resistor 210 of FIG. 2. FIG. 4 is a diagram of a poly-resistor 410 according to an embodiment of the invention. FIG. 4 is similar to FIG. 2. In the embodiment of FIG. 4, a channel layer 430 of the poly-resistor 410 is a P-type doped layer, which may be configured in an N-type doped layer 450, and a first end 431 and a second end 432 of the channel layer 430 are p+ doped regions. An insulation layer 440 can be of different materials, such as a silicon dioxide layer, a field oxide (FOX) layer, or a STI layer, but is not limited thereto. Other features of the poly-resistor 410 of FIG. 4 are similar to those of the poly-resistor 210 of FIG. 2.

Figure 5A:
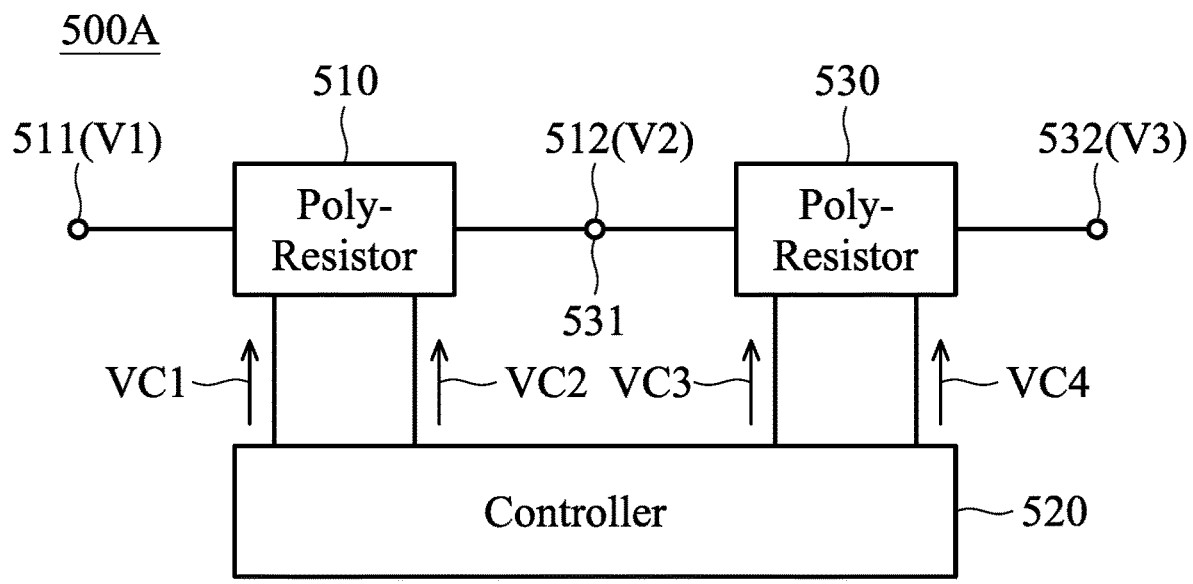
FIG. 5A is a diagram of an impedance circuit according to an embodiment of the invention.

FIG. 5A is a diagram of an impedance circuit 500A according to an embodiment of the invention. FIG. 5A is similar to FIG. 1. In the embodiment of FIG. 5A, the impedance circuit 500A includes a first poly-resistor 510, a second poly-resistor 530, and a controller 520. The first poly-resistor 510 has a first terminal 511 and a second terminal 512. The second poly-resistor 530 has a first terminal 531 and a second terminal 532. The first terminal 531 of the second poly-resistor 530 is coupled to the second terminal 512 of the first poly-resistor 510. The controller 520 is configured to generate a first control voltage VC1, a second control voltage VC2, a third control voltage VC3, and a fourth control voltage VC4 for controlling the first poly-resistor 510 and the second poly-resistor 530. The resistance between the first terminal 511 and the second terminal 512 of the first poly-resistor 510 is determined according to the first control voltage VC1 and the second control voltage VC2. In one embodiment, the second control voltage VC2 is different from the first control voltage VC1. The resistance between the first terminal 531 and the second terminal 532 of the second poly-resistor 530 is determined according to the third control voltage VC3 and the fourth control voltage VC4. In one embodiment, the fourth control voltage VC4 is different from the third control voltage VC3.

In the impedance circuit 500A, a first poly-resistor 510 and a second poly-resistor 530 are coupled in series. The first control voltage VC1, the second control voltage VC2, the third control voltage VC3 and the fourth control voltage VC4 may be dynamic. The first control voltage VC1 and the second control voltage VC2 may be determined according to a first voltage V1 at the first terminal 511 of the first poly-resistor 510, and a second voltage V2 at the second terminal 512 of the first poly-resistor 510. Each of the first control voltage VC1 and the second control voltage VC2 may be a function of the first voltage V1 and the second voltage V2. The aforementioned function may be linear. For example, the first control voltage VC1 may be substantially equal to the first voltage V1, and the second control voltage VC2 may be substantially equal to the second voltage V2, but they are not limited thereto. The third control voltage VC3 and the fourth control voltage VC4 may be determined according to the second voltage V2 at the first terminal 531 of the second poly-resistor 530, and a third voltage V3 at the second terminal 532 of the second poly-resistor 530. Each of the third control voltage VC3 and the fourth control voltage VC4 may be a function of the second voltage V2 and the third voltage V3. The aforementioned function may be linear. For example, the third control voltage VC3 may be substantially equal to the second voltage V2, and the fourth control voltage VC4 may be substantially equal to the third voltage V3, but they are not limited thereto. Other features of the impedance circuit 500A of FIG. 5A are similar to those of the impedance circuit 100 of FIG. 1. Accordingly, the two embodiments can achieve similar levels of performance. It should be noted that the impedance circuit 500A may include three or more poly-resistors which are coupled in series and controlled by the controller in a similar way although there are only two poly-resistors displayed in FIG. 5A.

Figure 5B:
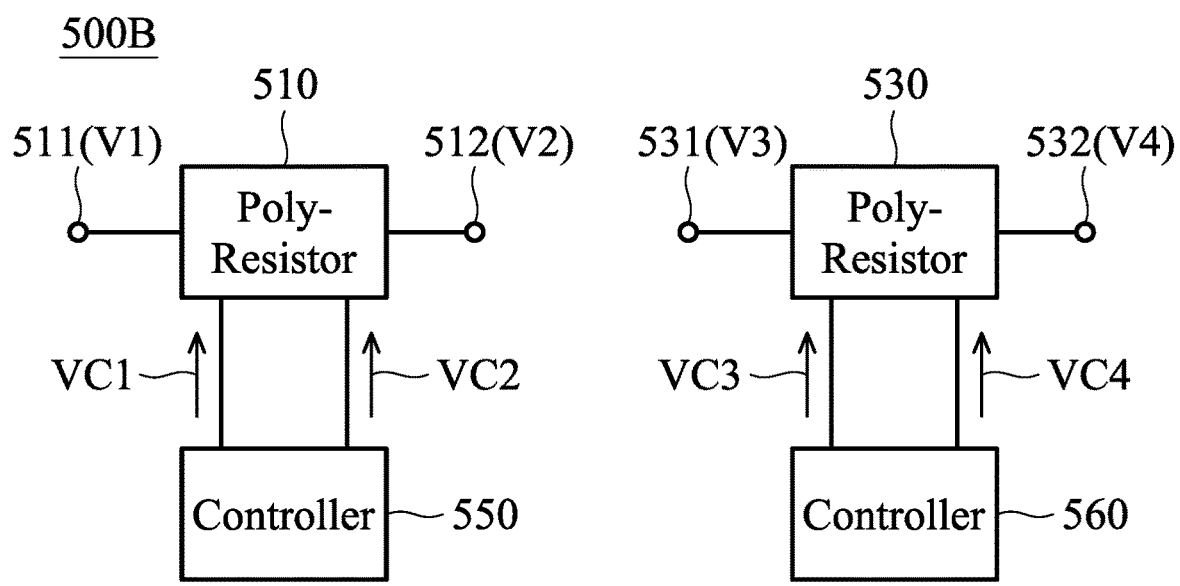
FIG. 5B is a diagram of an impedance circuit according to another embodiment of the invention.

FIG. 5B is a diagram of an impedance circuit 500B according to another embodiment of the invention. FIG. 5B is similar to FIG. 5A. In the embodiment of FIG. 5B, the impedance circuit 500B further includes a first controller 550 and a second controller 560. Such a design can also suppress the non-linear depletion effect. The first controller 550 is configured to generate the first control voltage VC1 and the second control voltage VC2 for controlling the first poly-resistor 510. The second controller 560 is configured to generate the third control voltage VC3 and the fourth control voltage VC4 for controlling the second poly-resistor 530. Similarly, the first control voltage VC1, the second control voltage VC2, the third control voltage VC3, and the fourth control voltage VC4 may be dynamic. In the impedance circuit 500B, the second poly-resistor 530 is separate from the first poly-resistor 510. The first control voltage VC1 and the second control voltage VC2 may be determined according to a first voltage V1 at the first terminal 511 of the first poly-resistor 510, and a second voltage V2 at the second terminal 512 of the first poly-resistor 510. Each of the first control voltage VC1 and the second control voltage VC2 may be a function of the first voltage V1 and the second voltage V2. The aforementioned function may be linear. For example, the first control voltage VC1 may be substantially equal to the first voltage V1, and the second control voltage VC2 may be substantially equal to the second voltage V2, but they are not limited thereto. The third control voltage VC3 and the fourth control voltage VC4 may be determined according to a third voltage V3 at the first terminal 531 of the second poly-resistor 530, and a fourth voltage V4 at the second terminal 532 of the second poly-resistor 530. Each of the third control voltage VC3 and the fourth control voltage VC4 may be a function of the third voltage V3 and the fourth voltage V4. The aforementioned function may be linear. For example, the third control voltage VC3 may be substantially equal to the third voltage V3, and the fourth control voltage VC4 may be substantially equal to the fourth voltage V4, but they are not limited thereto. Other features of the impedance circuit 500B of FIG. 5B are similar to those of the impedance circuit 500A of FIG. 5A. It should be noted that the impedance circuit 500B may include three or even more poly-resistors which are respectively controlled by three or more controllers in a similar way.

The proposed impedance circuit and the poly-resistor therein can be applied to a variety of circuits. Please refer to the following embodiments in FIGS. 6-8.

Figure 6A:
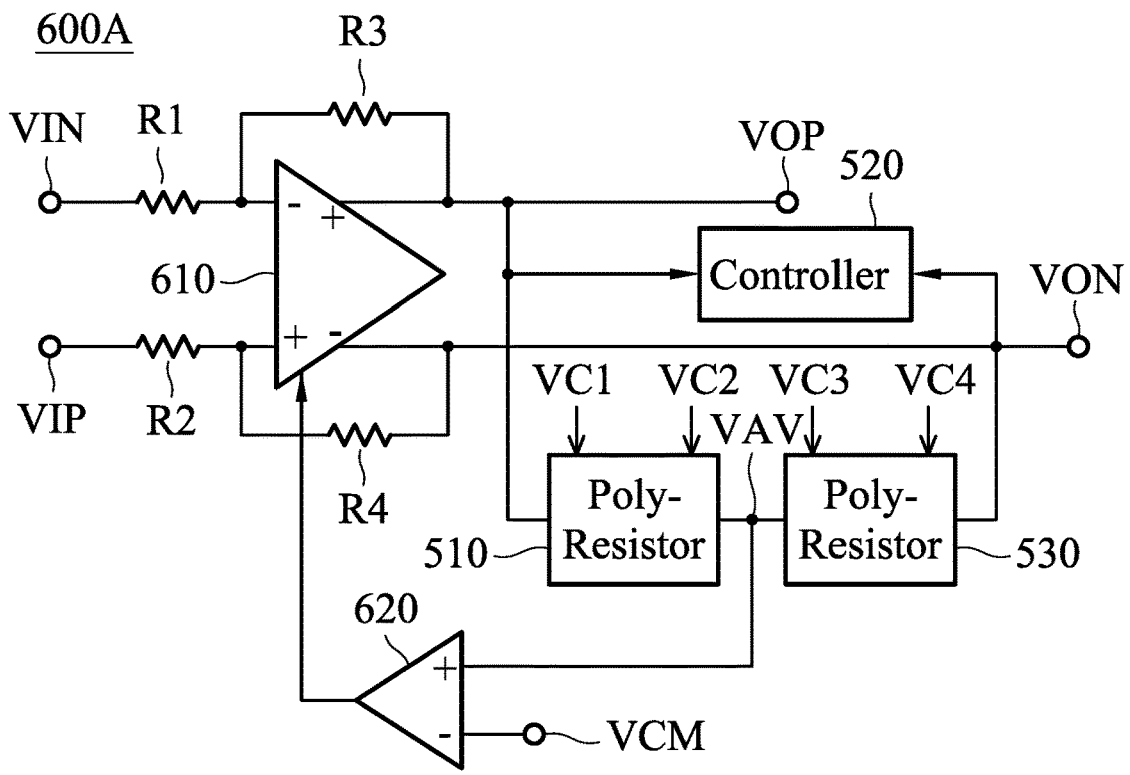
FIG. 6A is a diagram of a differential or pseudo-differential amplifier according to an embodiment of the invention.

FIG. 6A is a diagram of a differential or pseudo-differential amplifier 600A according to an embodiment of the invention. In the embodiment of FIG. 6A, the differential or pseudo-differential amplifier 600A generates a positive output voltage VOP and a negative output voltage VON according to a positive input voltage VIP and a negative input voltage VIN. Specifically, the differential or pseudo-differential amplifier 600A includes a main operational amplifier 610, an auxiliary operational amplifier 620, a first resistor R1, a second resistor R2, a third resistor R3, a fourth resistor R4, a controller 520, a first poly-resistor 510, and a second poly-resistor 530. The first resistor R1 is coupled between the negative input voltage VIN and a negative input terminal of the main operational amplifier 610. The second resistor R2 is coupled between the positive input voltage VIP and a positive input terminal of the main operational amplifier 610. The third resistor R3 is coupled between the negative input terminal and a positive output terminal (i.e., the positive output voltage VOP) of the main operational amplifier 610. The fourth resistor R4 is coupled between the positive input terminal and a negative output terminal (i.e., the negative output voltage VON) of the main operational amplifier 610. An inner voltage VAV is between the first poly-resistor 510 and the second resistor 530, and it may be close to a common voltage VCM. The first poly-resistor 510 is coupled between the positive output terminal (i.e., the positive output voltage VOP) of the main operational amplifier 610 and the inner voltage VAV. The second poly-resistor 530 is coupled between the inner voltage VAV and the negative output terminal (i.e., the negative output voltage VON) of the main operational amplifier 610. The auxiliary operational amplifier 620 compares the inner voltage VAV with the common voltage VCM, so as to adjust a DC (Direct Current) offset of the main operational amplifier 610 with a negative feedback mechanism. The common voltage VCM may be set to a ground voltage VSS (e.g., 0V). The controller 520 is configured to generate a first control voltage VC1 and a second control voltage VC2 for controlling the first poly-resistor 510, and further generate a third control voltage VC3 and a fourth control voltage VC4 for controlling the second poly-resistor 530. In some embodiments, the first control voltage VC1, the second control voltage VC2, the third control voltage VC3, and the fourth control voltage VC4 are determined according to the positive output voltage VOP, the negative output voltage VON, and the inner voltage VAV. Specifically, each of the first control signal VC1 and the second control signal VC2 may be dynamic and be a function of the positive output voltage VOP and the inner voltage VAV; and each of the third control signal VC3 and the fourth control signal VC4 may be dynamic and be a function of the inner voltage VAV and the negative output voltage VON. For example, the first control voltage VC1 may be substantially equal to the positive output voltage VOP, the second control voltage VC2 and the third control voltage VC3 may be both substantially equal to the inner voltage VAV, and the fourth control voltage VC4 may be substantially equal to the negative output voltage VON, but they are not limited thereto. In the embodiment of FIG. 6A, each of the first poly-resistor 510 and the second poly-resistor 530 is a common-mode feedback resistor used in the differential or pseudo-differential amplifier 600A.

Figure 6B:
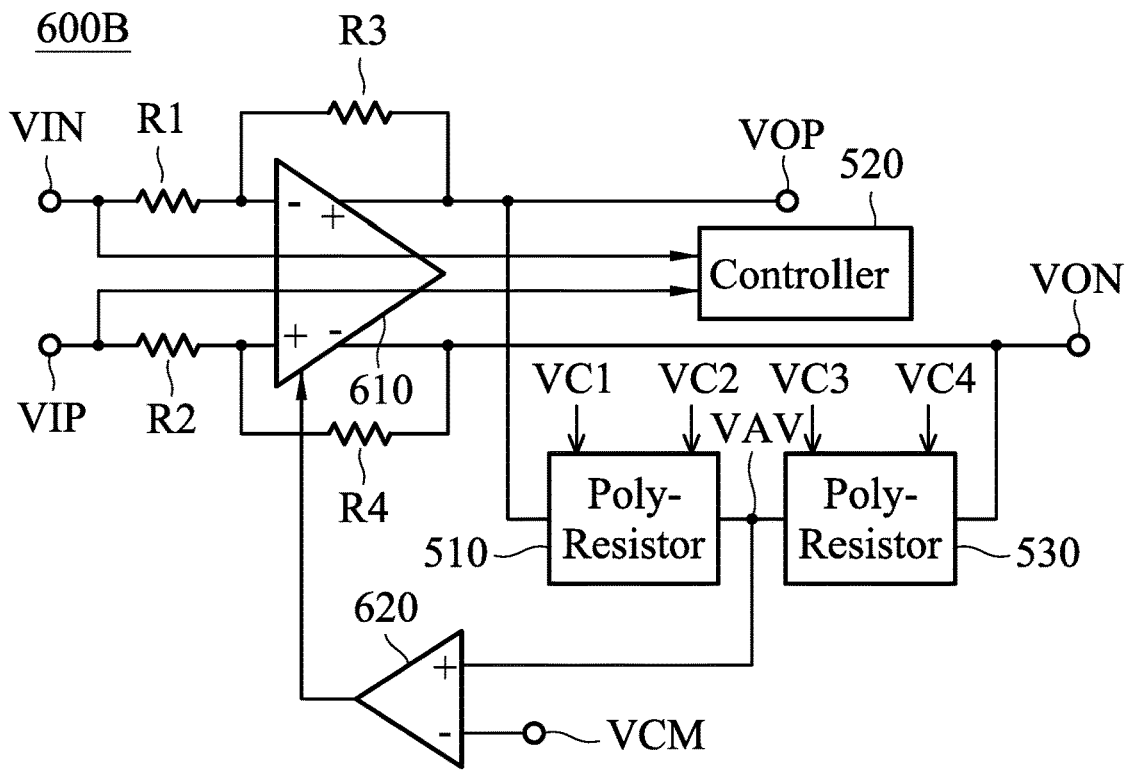
FIG. 6B is a diagram of a differential or pseudo-differential amplifier according to an embodiment of the invention.
Figure 6C:
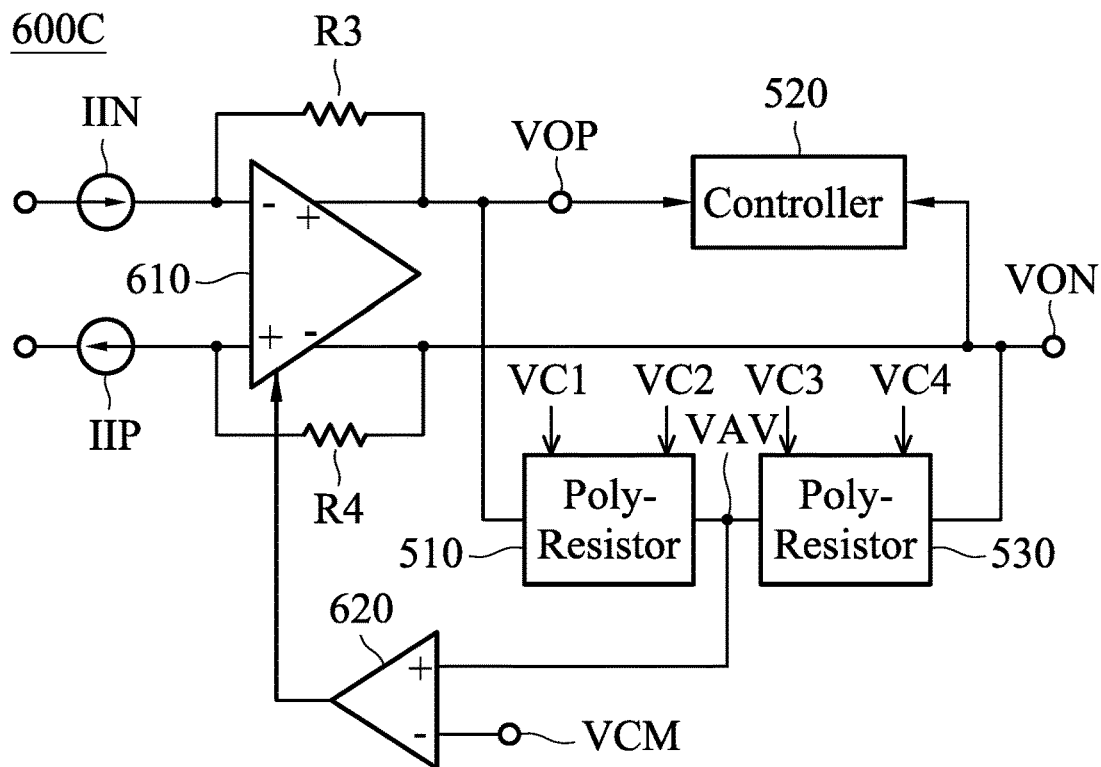
FIG. 6C is a diagram of a differential or pseudo-differential amplifier according to an embodiment of the invention.
Figure 6D:
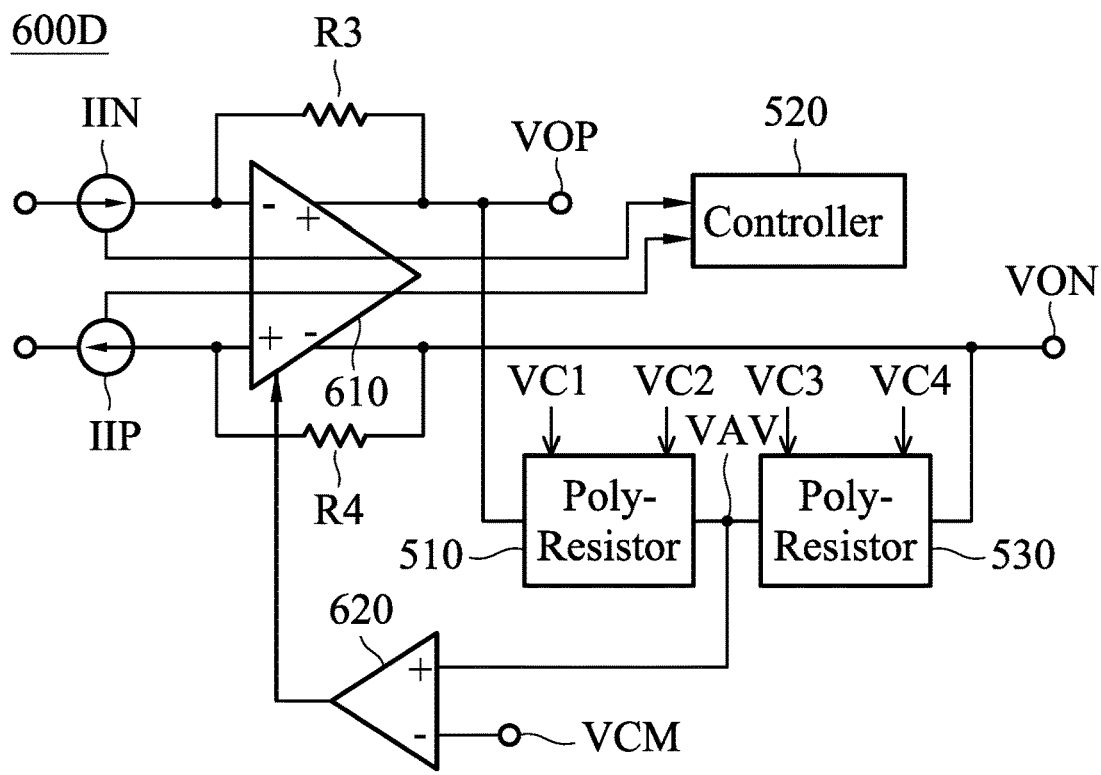
FIG. 6D is a diagram of a differential or pseudo-differential amplifier according to an embodiment of the invention.

FIG. 6B is a diagram of a differential or pseudo-differential amplifier 600B according to an embodiment of the invention. FIG. 6B is similar to FIG. 6A. In the embodiment of FIG. 6B, the controller 520 controls the first poly-resistor 510 and the second resistor 530 according to the positive input voltage VIP and the negative input voltage VIN, which are related to the positive output voltage VOP and the negative output voltage VON. FIG. 6C is a diagram of a differential or pseudo-differential amplifier 600C according to an embodiment of the invention. FIG. 6C is similar to FIG. 6A. In the embodiment of FIG. 6C, the differential or pseudo-differential amplifier 600C generates the positive output voltage VOP and the negative output voltage VON according to a positive input current IIP and a negative input current IIN. FIG. 6D is a diagram of a differential or pseudo-differential amplifier 600D according to an embodiment of the invention. FIG. 6D is similar to FIG. 6C. In the embodiment of FIG. 6D, the controller 520 controls the first poly-resistor 510 and the second resistor 530 according to the positive input current IIP and the negative input current IIN, which are related to the positive output voltage VOP and the negative output voltage VON. Other features of the differential or pseudo-differential amplifiers 600B, 600C, and 600D of FIGS. 6B, 6C, and 6D are similar to those of the differential or pseudo-differential amplifier 600A of FIG. 6A. Accordingly, these embodiments can achieve similar levels of performance.

Figure 7A:
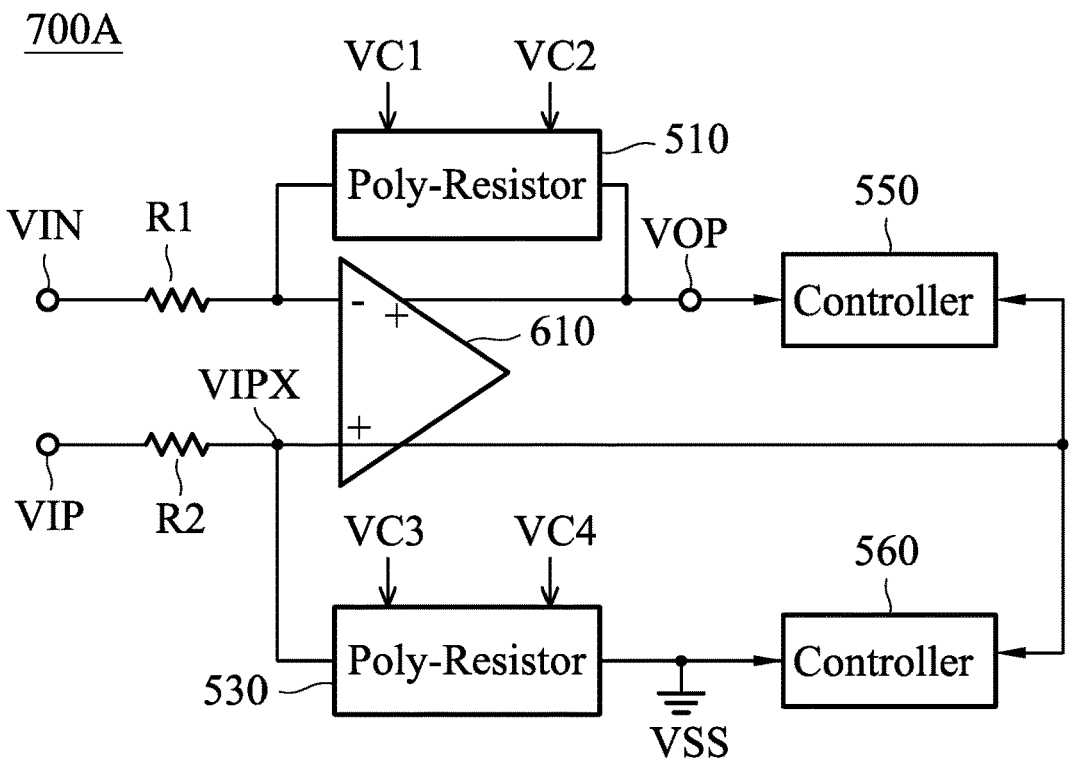
FIG. 7A is a diagram of a differential-to-single-ended amplifier according to an embodiment of the invention.

FIG. 7A is a diagram of a differential-to-single-ended amplifier 700A according to an embodiment of the invention. In the embodiment of FIG. 7A, the differential-to-single-ended amplifier 700A generates a positive output voltage VOP according to a positive input voltage VIP and a negative input voltage VIN. Specifically, the differential-to-single-ended amplifier 700A includes a main operational amplifier 610, a first resistor R1, a second resistor R2, a first poly-resistor 510, a second poly-resistor 530, a first controller 550, and a second controller 560. The first resistor R1 is coupled between the negative input voltage VIN and a negative input terminal of the main operational amplifier 610. The second resistor R2 is coupled between the positive input voltage VIP and a positive input terminal of the main operational amplifier 610. A positive inner voltage VIPX is at the positive input terminal of the main operational amplifier 610. The first poly-resistor 510 is coupled between the negative input terminal and a positive output terminal (i.e., the positive output voltage VOP) of the main operational amplifier 610. The second poly-resistor 530 is coupled between the positive input terminal of the main operational amplifier 610 and a ground voltage VSS. The first controller 550 is configured to generate a first control voltage VC1 and a second control voltage VC2 for controlling the first poly-resistor 510. The second controller 560 is configured to generate a third control voltage VC3 and a fourth control voltage VC4 for controlling the second poly-resistor 530. In some embodiments, the first control voltage VC1, the second control voltage VC2, the third control voltage VC3, and the fourth control voltage VC4 are determined according to the positive output voltage VOP, the positive inner voltage VIPX, and the ground voltage VSS. Specifically, each of the first control signal VC1 and the second control signal VC2 may be dynamic and be a function of the positive inner voltage VIPX and the positive output voltage VOP; and each of the third control signal VC3 and the fourth control signal VC4 may be dynamic and be a function of the positive inner voltage VIPX and the ground voltage VSS. For example, the first control voltage VC1 and the third control voltage VC3 may be substantially equal to the positive inner voltage VIPX, the second control voltage VC2 may be substantially equal to the positive output voltage VOP, and the fourth control voltage VC4 may be substantially equal to the ground voltage VSS, but they are not limited thereto. In the embodiment of FIG. 7A, each of the first poly-resistor 510 and the second poly-resistor 530 is a feedback resistor used in the differential-to-single-ended amplifier 700A.

Figure 7B:
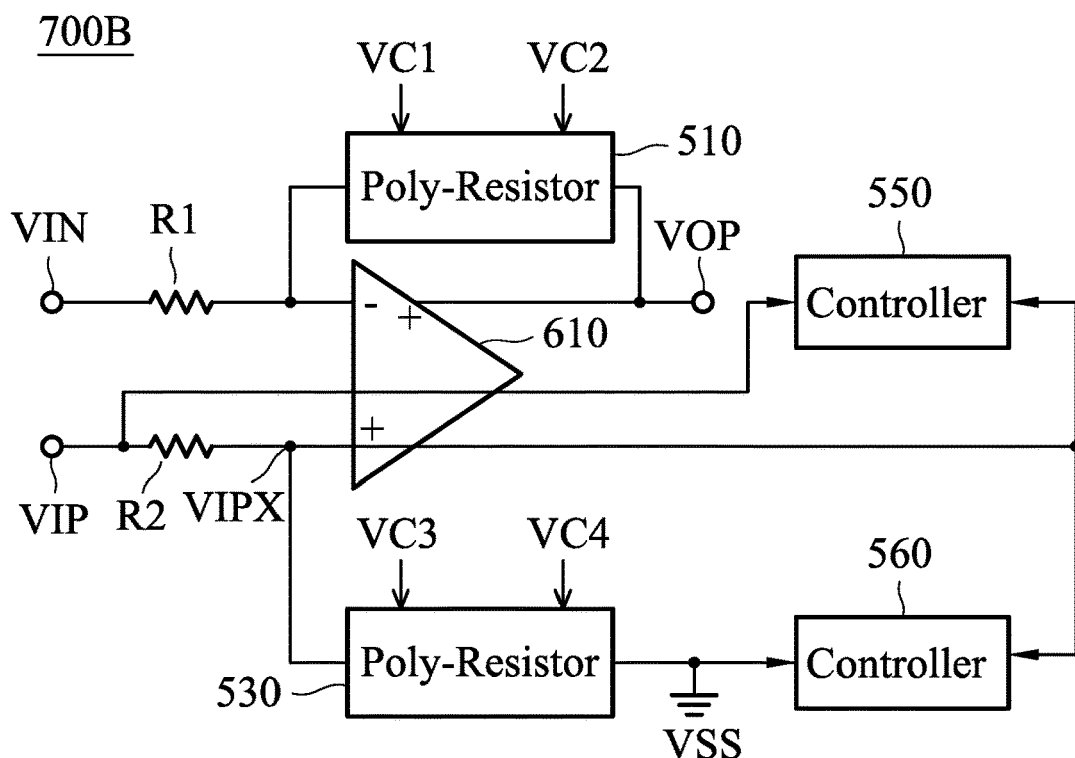
FIG. 7B is a diagram of a differential-to-single-ended amplifier according to an embodiment of the invention.
Figure 7C:
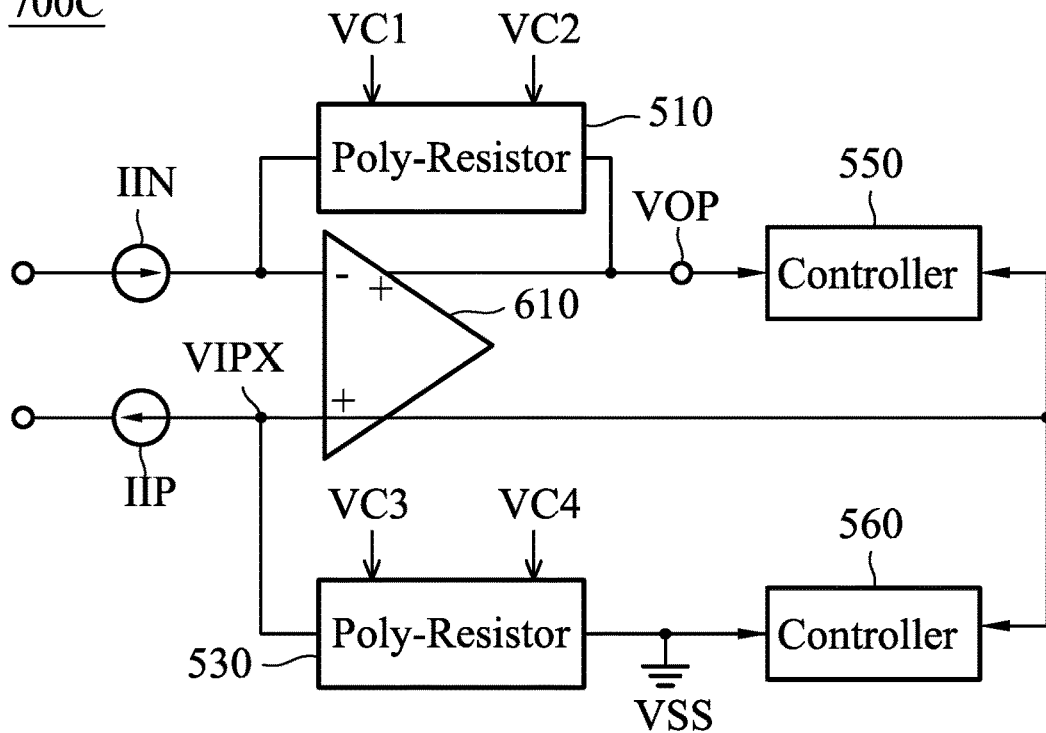
FIG. 7C is a diagram of a differential-to-single-ended amplifier according to an embodiment of the invention.
Figure 7D:
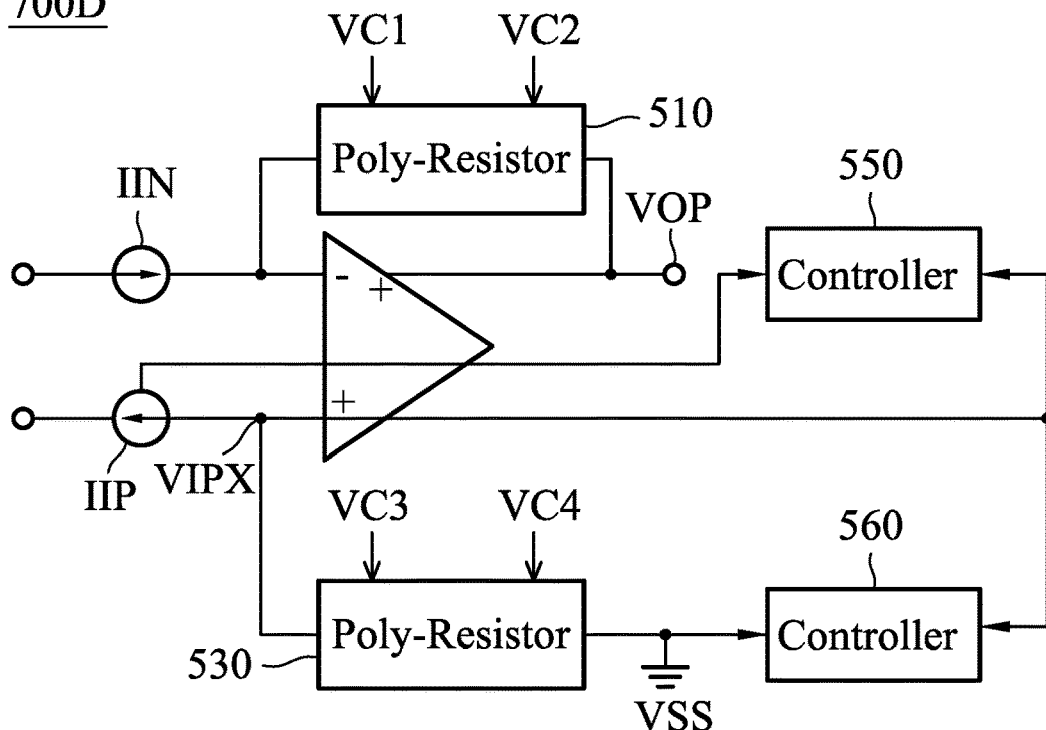
FIG. 7D is a diagram of a differential-to-single-ended amplifier according to an embodiment of the invention.

FIG. 7B is a diagram of a differential-to-single-ended amplifier 700B according to an embodiment of the invention. FIG. 7B is similar to FIG. 7A. In the embodiment of FIG. 7B, the first controller 550 controls the first poly-resistor 510 according to the positive input voltage VIP, which is related to the positive output voltage VOP. FIG. 7C is a diagram of a differential-to-single-ended amplifier 700C according to an embodiment of the invention. FIG. 7C is similar to FIG. 7A. In the embodiment of FIG. 7C, the differential-to-single-ended amplifier 700C generates the positive output voltage VOP according to a positive input current IIP and a negative input current IIN FIG. 7D is a diagram of a differential-to-single-ended amplifier 700D according to an embodiment of the invention. FIG. 7D is similar to FIG. 7C. In the embodiment of FIG. 7D, the first controller 550 controls the first poly-resistor 510 according to the positive input current IIP, which is related to the positive output voltage VOP. Other features of the differential-to-single-ended amplifiers 700B, 700C, and 700D of FIGS. 7B, 7C, and 7D are similar to those of the differential-to-single-ended amplifier 700A of FIG. 7A. Accordingly, these embodiments can achieve similar levels of performance.

Figure 8A:
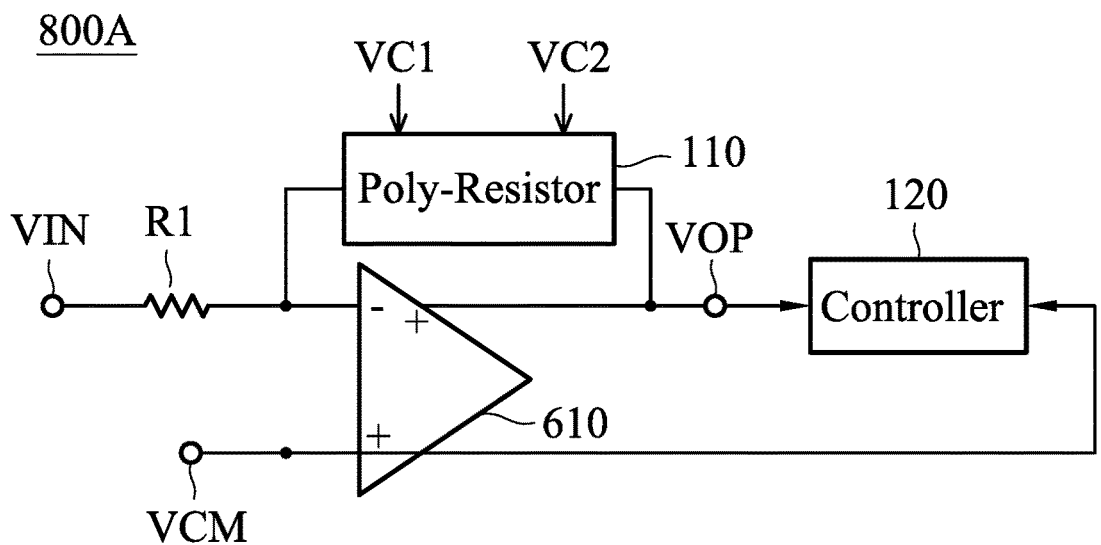
FIG. 8A is a diagram of an inverting amplifier according to an embodiment of the invention.

FIG. 8A is a diagram of an inverting amplifier 800A according to an embodiment of the invention. In the embodiment of FIG. 8A, the inverting amplifier 800A generates a positive output voltage VOP according to a negative input voltage VIN. Specifically, the inverting amplifier 800A includes a main operational amplifier 610, a first resistor R1, a controller 120, and a poly-resistor 110. The first resistor R1 is coupled between the negative input voltage VIN and a negative input terminal of the main operational amplifier 610. A common voltage VCM is at a positive input terminal of the main operational amplifier 610. The common voltage VCM may be set to a ground voltage VSS (e.g., 0V). The poly-resistor 110 is coupled between the negative input terminal and a positive output terminal (i.e., the positive output voltage VOP) of the main operational amplifier 610. The controller 120 is configured to generate a first control voltage VC1 and a second control voltage VC2 for controlling the poly-resistor 110. In some embodiments, the first control voltage VC1 and the second control voltage VC2 are determined according to the positive output voltage VOP and the common voltage VCM. Specifically, each of the first control signal VC1 and the second control signal VC2 may be dynamic and be a function of the positive output voltage VOP and the common voltage VCM. For example, the first control voltage VC1 may be substantially equal to the common voltage VCM, and the second control voltage VC2 may be substantially equal to the positive output voltage VOP, but they are not limited thereto. In the embodiment of FIG. 8A, the poly-resistor 110 is a feedback resistor used in the inverting amplifier 800A.

Figure 8B:
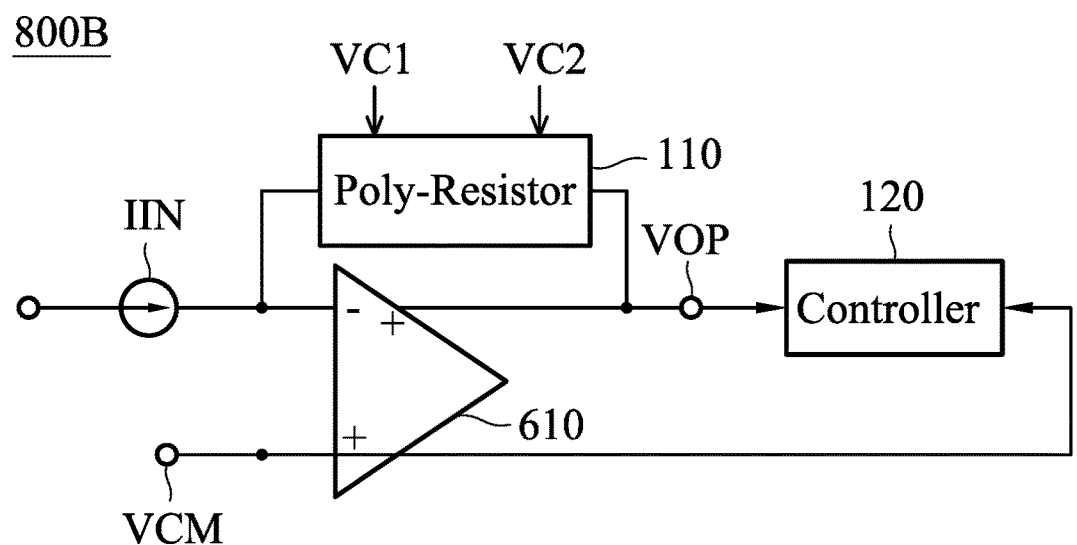
FIG. 8B is a diagram of an inverting amplifier according to an embodiment of the invention.
Figure 8C:
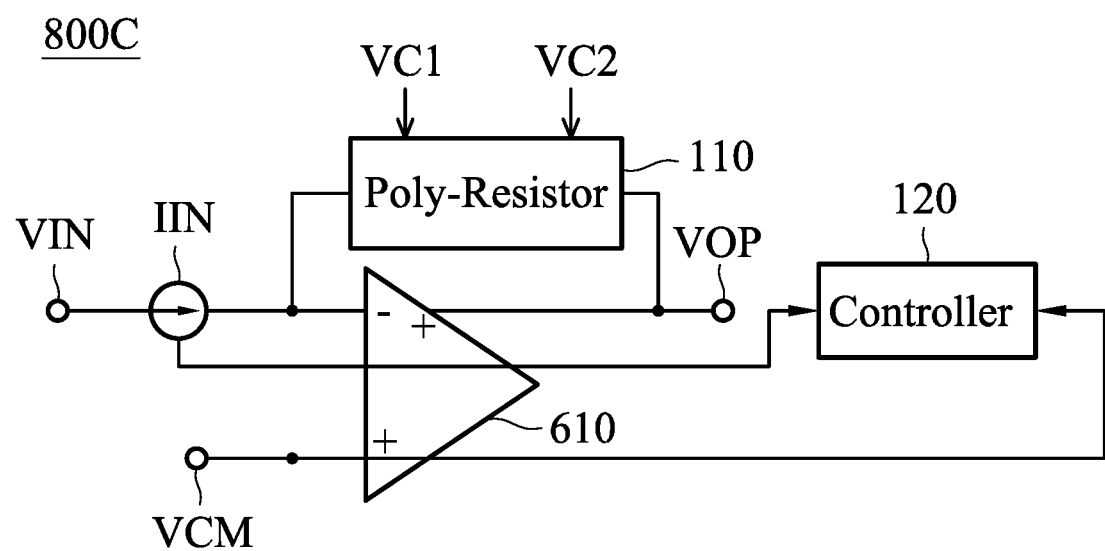
FIG. 8C is a diagram of an inverting amplifier according to an embodiment of the invention.

FIG. 8B is a diagram of an inverting amplifier 800B according to an embodiment of the invention. FIG. 8B is similar to FIG. 8A. In the embodiment of FIG. 8B, the inverting amplifier 800B generates the positive output voltage VOP according to a negative input current IIN. FIG. 8C is a diagram of an inverting amplifier 800C according to an embodiment of the invention. FIG. 8C is similar to FIG. 8B. In the embodiment of FIG. 8C, the controller 120 controls the poly-resistor 110 according to the positive input current IIN, which is related to the positive output voltage VOP. Other features of the inverting amplifiers 800B and 800C of FIG. 8B and FIG. 8C are similar to those of the inverting amplifier 800A of FIG. 8A. Accordingly, these embodiments can achieve similar levels of performance.

The invention proposes a novel impedance circuit including a poly-resistor and a controller. The proposed controller can compensate for non-linearity of the poly-resistor. Alternatively, the poly-resistor may be further divided into a plurality of sub-poly-resistors coupled in series, without affecting the performance of the proposed impedance circuit. To be brief, the proposed impedance circuit can eliminate the depletion effect of the poly-resistor, and make the poly-resistor be more linear and subject to Ohm's law.

Note that the above voltages, currents, resistances, inductances, capacitances and other element parameters are not limitations of the invention. A designer can adjust these parameters according to different requirements. The impedance circuit and poly-resistor of the invention are not limited to the configurations of FIGS. 1-8. The invention may merely include any one or more features of any one or more embodiments of FIGS. 1-8. In other words, not all of the features displayed in the figures should be implemented in the impedance circuit and poly-resistor of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An amplifier, comprising:
a first operational amplifier;
a poly-resistor, having a first terminal, a second terminal, a first control terminal and a second control terminal, wherein the poly-resistor is coupled to an output of the first operational amplifier and wherein the poly-resistor comprises a plurality of sub-poly-resistors coupled in series;

a controller, providing a first control voltage to the first control terminal and a second control voltage to the second control terminal; and a second operational amplifier that receives an inner voltage from a terminal connected between respective sub-poly resistors of the plurality of sub-poly-resistors, wherein a resistance between the first terminal and the second terminal of the poly-resistor is set by the first control voltage and the second control voltage;

wherein the second control voltage is different from the first control voltage.

2. The amplifier as claimed in claim 1, wherein the poly-resistor comprises:

a poly-silicon layer, having a first end and a second end, wherein the first end of the poly-silicon layer is coupled to the first terminal of the poly-resistor, and the second end of the poly-silicon layer is coupled to the second terminal of the poly-resistor;

a channel layer, having a first end and a second end, wherein the first end of the channel layer is arranged for receiving the first control voltage, and the second end of the channel layer is arranged for receiving the second control voltage; and an insulation layer, disposed between the poly-silicon layer and the channel layer.

3. The amplifier as claimed in claim 2, wherein the first end of the channel layer is closer to the first end of the poly-silicon layer than to the second end of the poly-silicon layer.

4. The amplifier as claimed in claim 2, wherein the channel layer is a conductive layer, a semiconductor layer, or another poly-silicon layer.

5. The amplifier as claimed in claim 2, wherein the channel layer is an n-well, and the first end and the second end of the channel layer are n+ doped regions.

6. The amplifier as claimed in claim 2, wherein the channel layer is a p-well, and the first end and the second end of the channel layer are p+ doped regions.

7. The amplifier as claimed in claim 2, wherein the insulation layer is a silicon dioxide layer, a field oxide (FOX) layer, or a shallow trench isolation (STI) layer.

8. The amplifier as claimed in claim 1, wherein the first control voltage and the second control voltage are dynamic.

9. The amplifier as claimed in claim 1, wherein the amplifier is a differential or a pseudo-differential amplifier.

10. The amplifier as claimed in claim 1, wherein the amplifier is a differential-to-single-ended amplifier.

11. The amplifier as claimed in claim 1, wherein the amplifier is an inverting amplifier.

12. The amplifier as claimed in claim 1, wherein the second operational amplifier controls a direct current offset of the first operational amplifier based on the inner voltage.

13. The amplifier as claimed in claim 1, wherein the first control voltage and the second control voltage are each determined according to both a first voltage at the first terminal of the poly-resistor and a second voltage at the second terminal of the poly-resistor.

14. The amplifier as claimed in claim 13, wherein each of the first control voltage and the second control voltage is a linear function the first voltage and the second voltage.

15. The amplifier as claimed in claim 13, wherein the first control voltage is substantially equal to the first voltage, and the second control voltage is substantially equal to the second voltage.

* * * * *